United States Patent
Wakasugi et al.

(10) Patent No.: US 9,673,791 B2
(45) Date of Patent: Jun. 6, 2017

(54) SCHMITT TRIGGER CIRCUIT AND POWER SUPPLY MONITORING APPARATUS

(71) Applicant: Yazaki Corporation, Tokyo (JP)

(72) Inventors: Yasutaka Wakasugi, Shizuoka (JP); Takaaki Ishii, Shizuoka (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 97 days.

(21) Appl. No.: 14/807,493

(22) Filed: Jul. 23, 2015

(65) Prior Publication Data

US 2016/0028382 A1  Jan. 28, 2016

(30) Foreign Application Priority Data

Jul. 24, 2014  (JP) ................................. 2014-150658

(51) Int. Cl.
| | |
|---|---|
| *H03K 3/00* | (2006.01) |
| *H03K 3/2893* | (2006.01) |
| *H03K 3/13* | (2006.01) |
| *H03K 3/0233* | (2006.01) |
| *H03K 3/037* | (2006.01) |

(52) U.S. Cl.
CPC ....... *H03K 3/2893* (2013.01); *H03K 3/02337* (2013.01); *H03K 3/0377* (2013.01); *H03K 3/13* (2013.01)

(58) Field of Classification Search
None
See application file for complete search history.

(56) References Cited

U.S. PATENT DOCUMENTS

| | | | | |
|---|---|---|---|---|
| 3,178,585 A | * | 4/1965 | Kerenyi | H03K 3/2893 327/100 |
| 3,471,718 A | * | 10/1969 | Weisz | H03K 3/2893 327/205 |
| 3,581,120 A | * | 5/1971 | Nord | H03K 3/2893 327/205 |
| 3,584,241 A | * | 6/1971 | Nakamura | H03K 3/2893 327/205 |
| 3,816,767 A | * | 6/1974 | Meri | H03K 3/2893 327/205 |
| 4,086,503 A | * | 4/1978 | Fox | H01L 31/12 257/E31.095 |
| 4,301,379 A | * | 11/1981 | Reinert | H03K 3/2893 327/199 |
| 4,599,902 A | * | 7/1986 | Gray | G01L 9/0032 250/231.19 |
| 6,342,997 B1 | * | 1/2002 | Khadkikar | G01K 7/01 361/100 |
| 2001/0055945 A1 | * | 12/2001 | Neborsky | G07D 9/008 453/17 |

FOREIGN PATENT DOCUMENTS

JP  2014-033533 A  2/2014

* cited by examiner

*Primary Examiner* — Tuan T Lam
(74) *Attorney, Agent, or Firm* — Sughrue Mion, PLLC (57) ABSTRACT

A Schmitt trigger circuit according to an embodiment includes a voltage dividing circuit that divides an input voltage and outputs a divided voltage, and a basic Schmitt trigger circuit that includes a transistor as a current controlling element and controls current flowing through a light emitting diode (LED) included in an external photocoupler on the basis of the output voltage of the voltage dividing circuit proportional to the input voltage. The voltage dividing circuit has a positive temperature coefficient.

7 Claims, 4 Drawing Sheets

SCHMITT TRIGGER CIRCUIT AND POWER SUPPLY MONITORING APPARATUS

CROSS-REFERENCE TO RELATED APPLICATION(S)

The present application claims priority to and incorporates by reference the entire contents of Japanese Patent Application No. 2014-150658 filed in Japan on Jul. 24, 2014.

BACKGROUND OF THE INVENTION

1. Field of the Invention

The present invention relates to a Schmitt trigger circuit and a power supply monitoring apparatus.

2. Description of the Related Art

Recent years have seen the spread of electric vehicles. In such circumstances, a configuration has been developed in which electric power is output from an electric vehicle battery to the outside so as to use the power for emergency.

In order to implement such a configuration, a power supply control apparatus for electric vehicles has been developed. Such a power supply control apparatus includes a mechanical relay that electrically connects an electric vehicle battery for driving a vehicle to an outlet for outputting power.

Such a power supply control apparatus has a voltage output function and a current output function so as to report a voltage or a supply current of the vehicle battery to an external electronic control unit (ECU) while the power is supplied through the mechanical relay. Conventional technologies are described in Japanese Laid-open Patent Publication No 2014-033533 for example.

A vehicle battery for driving a vehicle is set for a relatively high voltage (e.g., 275 V to 650 V), and thus needs to be electrically insulated from an output circuit (a communication interface) that operates at a relatively low voltage (e.g., 12 V) and communicates with an external ECU.

For this reason, a relatively high-voltage circuit and a relatively low-voltage circuit are electrically insulated from each other using a photocoupler.

In addition, a voltage fluctuation range of a vehicle battery may be large, fluctuating from 40 V to 650 V for example. Furthermore, in order to ensure stable operation of a power supply control apparatus, a light emitting diode (LED) included in a photocoupler is driven by using a Schmitt trigger circuit having hysteresis so that monitoring results do not vary with some voltage fluctuation in a certain voltage range of a vehicle battery that can supply power for emergency.

Meanwhile, a current proportional to a detected voltage flows through an LED included in a photocoupler, and an external ECU simply determines whether a voltage equal to or larger than a certain voltage is detected. In consideration of the life of the LED or other conditions, it is desired to limit current when a voltage of the vehicle battery is equal to or larger than the certain voltage. Improvement in the accuracy of voltage measurement has also been desired.

SUMMARY OF THE INVENTION

In view of the foregoing, the present invention provides a Schmitt trigger circuit that can improve the accuracy of voltage measurement while extending the life of an LED included in a photocoupler, and a power supply monitoring apparatus that uses the Schmitt trigger circuit.

It is an object of the present invention to at least partially solve the problems in the conventional technology.

The above object of the present invention is achieved by the following configurations.

According to one aspect of the present invention, a Schmitt trigger circuit includes a voltage dividing circuit configured to divide an input voltage and output a divided voltage; and a basic Schmitt trigger circuit configured to include a transistor as a current controlling element and control current flowing through a light emitting diode (LED) included in an external photocoupler on the basis of an output voltage of the voltage dividing circuit proportional to the input voltage. Here, the voltage dividing circuit has a positive temperature coefficient.

According to another aspect of the present invention, the voltage dividing circuit includes a Zener diode connected in a reverse direction, and a voltage-dividing resistor connected to a low-potential side of the Zener diode.

According to still another aspect of the present invention, the Zener diode has a positive temperature coefficient.

According to still another aspect of the present invention, the basic Schmitt trigger circuit further includes a first NPN transistor including a base terminal connected to an output terminal of the voltage dividing circuit, and a second NPN transistor including a base terminal connected to a collector terminal of the first NPN transistor. Here, the LED has a cathode terminal connected to a junction point between the collector terminal of the first NPN transistor and the base terminal of the second NPN transistor.

According to still another aspect of the present invention, a power supply monitoring apparatus includes a Schmitt trigger circuit including a first voltage dividing circuit configured to divide an input voltage from an external power supply and output a divided voltage, and a basic Schmitt trigger circuit configured to include a second voltage dividing circuit having a positive temperature coefficient and dividing an output voltage of the first voltage dividing circuit, and a transistor as a current controlling element, and control current flowing through a light emitting diode (LED) included in a photocoupler on the basis of an output voltage of the second voltage dividing circuit; and an output circuit configured to include a phototransistor included in the photocoupler and output power source monitoring information to outside.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following explains a preferred embodiment with reference to the drawings.

Figure 1:
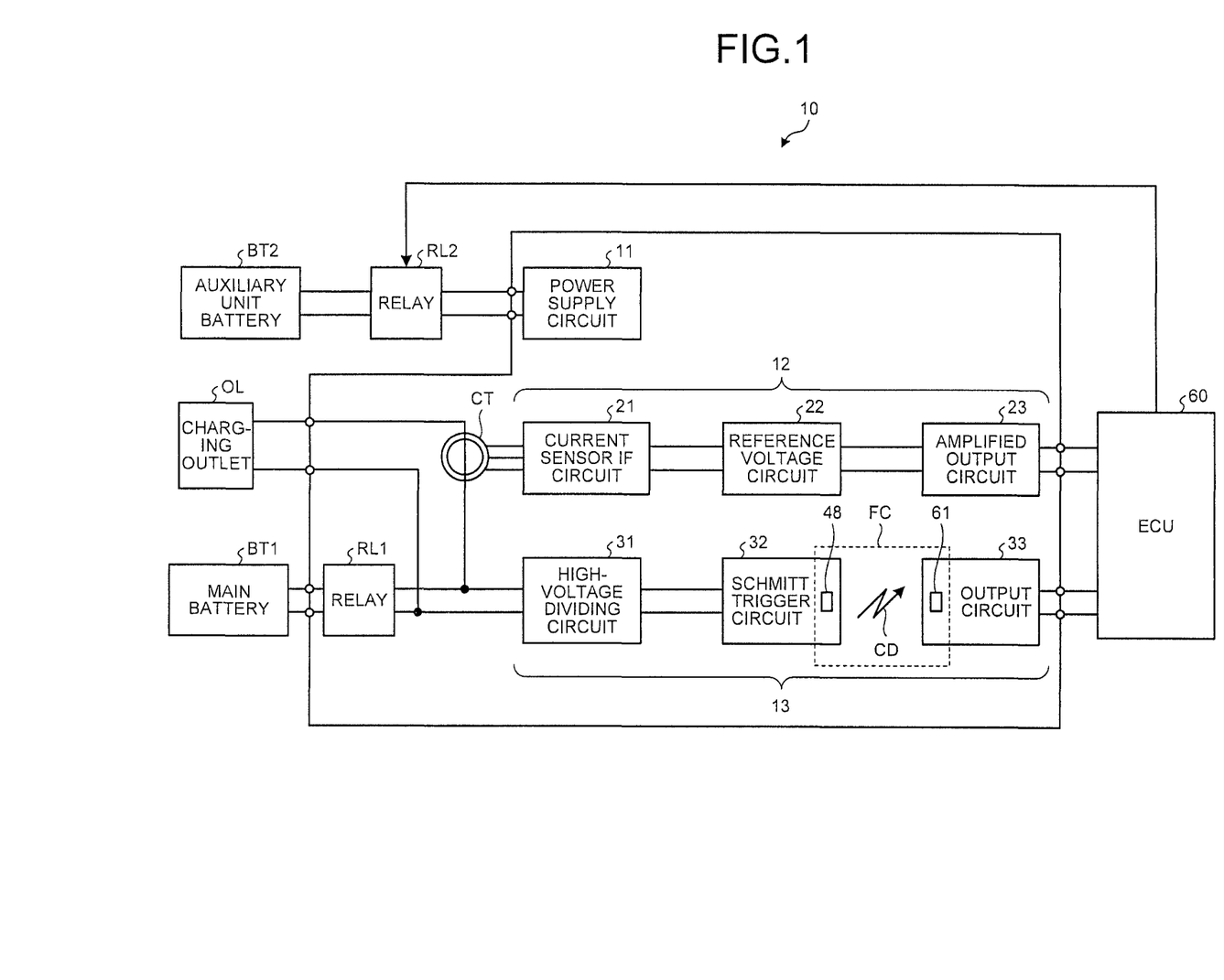
FIG. 1 is a block diagram of a general structure of a power supply monitoring apparatus according to an embodiment.

FIG. 1 is a block diagram of a general structure of a power supply monitoring apparatus according to an embodiment.

When a main battery BT1 as a vehicle battery for driving a vehicle is connected to a charging outlet OL as a power supply terminal through a relay RL1, a power supply monitoring apparatus 10 detects and outputs a supply power current to an external ECU (a vehicle ECU) 60 and, while insulating the main battery BT1 that is a high-voltage system from the ECU 60 that is a low-voltage system, detects and outputs a supply power voltage to the ECU 60.

In this case, the power supply monitoring apparatus 10 turns on and off the relay RL1 under the control of the ECU 60.

The power supply monitoring apparatus 10 mainly includes a power supply circuit 11, a current detecting circuit 12, and a voltage detecting circuit 13. The power supply circuit 11 stabilizes (regulates) power supplied from an auxiliary unit battery BT2 for driving an in-vehicle auxiliary unit through the relay RL2 and supplies the power to the entire power supply monitoring apparatus 10. The current detecting circuit 12 is connected to a current sensor CT for detecting a supply power current of the main battery BT1 and outputs a current detection signal corresponding to the detected current. The voltage detecting circuit 13 detects a voltage of the main battery BT1 through the relay RL1 and, while insulating the high-voltage system from the low-voltage system, outputs a voltage detection signal.

The current detecting circuit 12 includes a current sensor interface (IF) circuit 21, a reference voltage circuit 22, and an amplified output circuit 23. The current sensor IF circuit 21 supplies power for current detection to the current sensor CT and processes a signal detected by the current sensor CT so as to output the signal as a current detection signal. The reference voltage circuit 22 generates and outputs a reference voltage signal having a certain reference voltage. The amplified output circuit 23 compares the voltage of the current detection signal output by the current sensor IF circuit 21 and the reference voltage signal output by the reference voltage circuit 22 and outputs an amplified current detection signal to the ECU 60.

The voltage detecting circuit 13 includes a high-voltage dividing circuit 31, a Schmitt trigger circuit 32, and an output circuit 33. The high-voltage dividing circuit 31 serves as a first voltage dividing circuit that divides and outputs a voltage of the main battery BT1 applied through the relay RL1. The Schmitt trigger circuit 32 outputs a voltage detection signal CD of "H" level when the voltage divided by the high-voltage dividing circuit 31 is larger than a first threshold voltage, and outputs a voltage detection signal CD of "L" level through an LED 48 included in a photocoupler FC when the divided voltage is smaller than a second threshold voltage that is smaller than the first threshold voltage. The output circuit 33 receives an input of the voltage detection signal through the LED 48 and a phototransistor 61 included in the photocoupler FC and outputs the received signal as a voltage detection signal for a low-voltage system to the ECU 60.

In the above-described configuration, the voltage detecting circuit 13 has a function that outputs a voltage detection signal of "H" level to the ECU 60 when the relay RL1 normally turns on and the voltage is capable of supplying power.

The ECU 60 can determine whether the relay RL1 is normally operating (turning on and off) on the basis of a voltage detection signal output by the voltage detecting circuit 13, and performs various control on the basis of the voltage detection signal and an amplified current detection signal output by the current detecting circuit 12.

The following explains the Schmitt trigger circuit 32 in detail.

Figure 2:
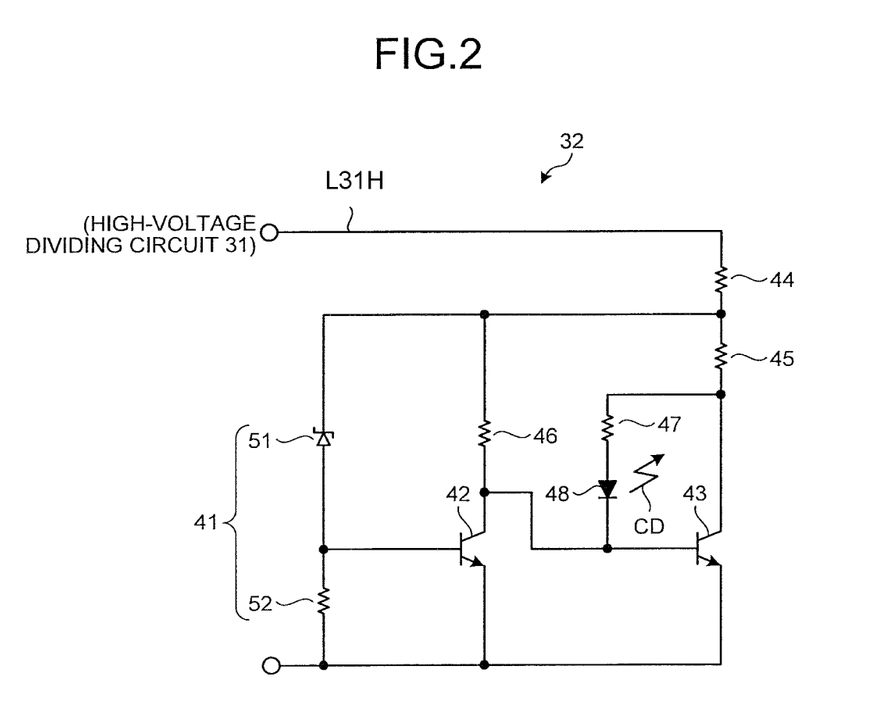
FIG. 2 is a diagram for explaining an exemplary circuit structure of a Schmitt trigger circuit.

FIG. 2 is a diagram for explaining an exemplary circuit structure of a Schmitt trigger circuit.

The Schmitt trigger circuit 32 includes a voltage dividing circuit 41, a first NPN transistor 42, a second NPN transistor 43, and a current limiting resistor 44. The voltage dividing circuit 41 serves as a second voltage dividing circuit that further divides the voltage of the main battery BT1 divided by the high-voltage dividing circuit 31. The first NPN transistor 42 includes a base terminal to which the voltage divided by the voltage dividing circuit 41 is applied, and an emitter terminal connected to the ground. The second NPN transistor 43 includes a base terminal connected to the collector terminal of the first NPN transistor 42, and an emitter terminal connected to the ground and an output terminal. The current limiting resistor 44 is connected to a high-potential side output line L31H of the high-voltage dividing circuit 31 at one end and connected to the voltage dividing circuit 41 at the other end.

Furthermore, the Schmitt trigger circuit 32 includes resistors 45, 46, and 47 and the LED 48. The resistor 45 is connected to a junction point between the voltage dividing circuit 41 and the current limiting resistor 44 at one end, and to the collector terminal of the second NPN transistor 43 at the other end. The resistor 46 is connected to a junction point between the voltage dividing circuit 41 and the current limiting resistor 44 at one end, and to the collector terminal of the first NPN transistor 42 at the other end. The resistor 47 is connected to a junction point between the resistor 45 and the second NPN transistor 43 at one end. The LED 48 includes an anode terminal connected to the other end of the resistor 47, and a cathode terminal connected to a junction point between the first NPN transistor 42 and the second NPN transistor 43, the LED 48 being included in the photocoupler FC.

In the above-described configuration, the first NPN transistor 42, the second NPN transistor 43, the resistor 45, and the resistor 46 constitute a basic Schmitt trigger circuit.

Note that the resistor 47 and the LED 48 are not included in an original Schmitt trigger circuit, and included in an external circuit that operates by an output from the Schmitt trigger circuit. However, for the convenience of explaining this configuration, the resistor 47 and the LED 48 are described as a part of the Schmitt trigger circuit.

The voltage dividing circuit 41 includes a Zener diode 51 and a resistor 52. The Zener diode 51 has a cathode terminal connected to a junction point between the current limiting resistor 44 and the resistor 45, and an anode terminal connected to the base terminal of the first NPN transistor 42. The resistor 52 is connected to the anode terminal of the Zener diode 51 at one end, and to the ground at the other end.

In the above-described configuration, in view of temperature property, the Zener diode 51 has been selected to have a positive temperature coefficient. In other words, a Zener diode having a property that decreases in resistance as temperature rises has been selected. In this configuration, the temperature property of an anode-cathode voltage is 4.4 mV/° C., for example.

By contrast, in view of temperature property, the first NPN transistor 42 has a negative temperature coefficient. In other words, the first NPN transistor 42 has a property that increases in resistance as temperature rises. For example, the temperature property of a base-emitter voltage (Vbe) is −2.2 mV/° C.

Consequently, the fluctuation in emitter-collector current due to the fluctuation in ambient temperature is partly canceled out, and thus reduced, by the temperature property of the Zener diode 51, thereby improving the accuracy of measurement performed by the voltage detecting circuit 13.

The following explains operation performed in the embodiment.

Figure 3:
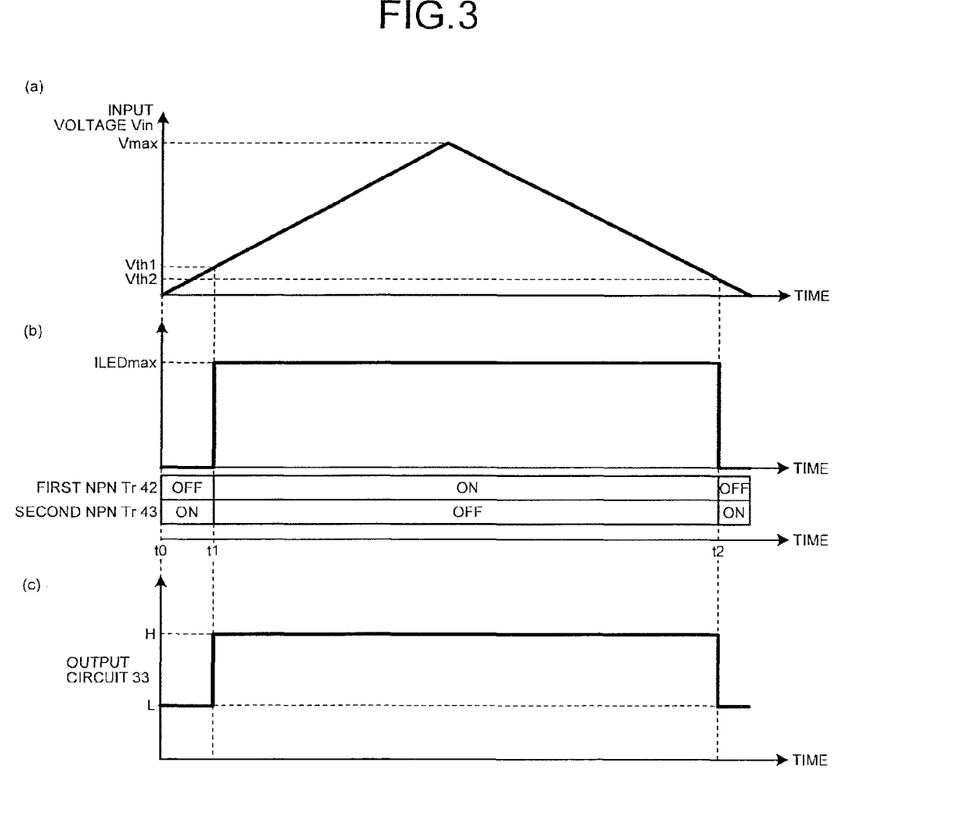
FIG. 3 is a diagram for explaining operation of the Schmitt trigger circuit.

FIG. 3 is diagram for explaining operation of the Schmitt trigger circuit.

In the following explanation, hysteresis of the Schmitt trigger circuit 32 has been presented by setting, for an input voltage Vin of the high-voltage dividing circuit 31, a first threshold voltage Vth1 at which current starts flowing through the LED 48 having no current and a second threshold voltage Vth2 (<Vth1) at which current stops flowing through the LED 48 having current.

The hysteresis is developed because values of currents flowing through the Schmitt trigger circuit 32 are different between immediately before the first NPN transistor 42 turns on and immediately before the first NPN transistor 42 turns off and thus an on-threshold voltage Vth_on for turning on the first NPN transistor 42 differs from an off-threshold voltage Vth_off for turning off the first NPN transistor 42.

The reason why the currents flowing through the Schmitt trigger circuit 32 are different between immediately before the first NPN transistor 42 turns on and immediately before the first NPN transistor 42 turns off is because paths of the currents are different despite the fact that the output voltages of the high-voltage dividing circuit 31 immediately before the transistor 42 turns on and immediately before the transistor 42 turns off are substantially the same.

That is, the current path (a current value I1) immediately before the first NPN transistor 42 turns on is: the resistor 44→the resistor 45→the second NPN transistor 43, and the current path (a current value I2) immediately before the first NPN transistor 42 turns off is: the resistor 44→the resistor 45→the resistor 47→the diode (LED) 48→the transistor 42.

In this case, by defining the voltage across the voltage dividing circuit 41, that is, the output voltage of the high-voltage dividing circuit 31 immediately before the first NPN transistor 42 turns on and the output voltage of the high-voltage dividing circuit 31 immediately before the first NPN transistor 42 turns off, as VX, and the resistance value of the resistor 44 as R44, the on-threshold voltage Vth_on and the off-threshold voltage Vth_off are given by the following expressions:

$$Vth\_on = R44 \times I1 + VX,$$

$$Vth\_off = R44 \times I2 + VX,$$

where the current value I1=(the output voltage VX−a saturated collector-emitter voltage of the second NPN transistor 43)/the resistance value of the resistor 45, the current value I2=(the output voltage VX−a voltage drop VF of the LED 48−a saturated collector-emitter voltage of the first NPN transistor 42)/(the resistance value of the resistor 45+the resistance value of the resistor 47), and the current value I1>the current value I2.

The calculations result in the on-threshold voltage Vth_on and the off-threshold voltage Vth_off that are different by the following value given by the following expression:

$$Vth\_on - Vth\_off = R44 \times (I1 - I2) > 0 \because I1 > I2,$$

and therefore, $$Vth\_on = Vth\_off + \{R44 \times (I1 - I2)\}.$$

Based on the difference, the hysteresis is developed.

In this configuration, the first threshold voltage Vth1 and the second threshold voltage Vth2 are defined as voltages each corresponding to a breakdown voltage (e.g., 8.2 V) of the Zener diode 51 depending on the output voltage of the high-voltage dividing circuit 31. In other words, when the output voltage of the high-voltage dividing circuit 31 is equal to or larger than the first threshold voltage Vth1 during voltage rise, a voltage corresponding to the breakdown voltage is applied between the anode and the cathode of the Zener diode 51, and when the output voltage of the high-voltage dividing circuit 31 is equal to or larger than the second threshold voltage Vth2 during voltage drop, a voltage corresponding to the breakdown voltage is applied between the anode and the cathode of the Zener diode 51.

The maximum value assumed for the input voltage Vin of the high-voltage dividing circuit 31 is a maximum voltage Vmax as illustrated in (a) in FIG. 3. A current that flows when the voltage is equal to or larger than the first threshold voltage Vth1 during voltage rise and a current that is flowing when the voltage is equal to or larger than the second threshold voltage Vth2 during voltage drop are within the range of a maximum current ILEDmax that has been set in consideration of the life of the LED 48 and to be sufficient for detection operation of the voltage detecting circuit.

The input voltage Vin of the high-voltage dividing circuit 31 should be a voltage proportional to the voltage of the main battery BT1. However, for facilitating the understanding of overall operation, the following explains a case in which the input voltage Vin (proportional to the voltage of the main battery BT1) of the high-voltage dividing circuit 31 rises to the maximum voltage Vmax at a constant rate of rise and then drops to 0 V at a constant rate of drop. In an initial state, the input voltage Vin of the high-voltage dividing circuit 31 is 0 V, and the LED 48 has no current.

(1) When the input voltage Vin of the high-voltage dividing circuit 31 is smaller than the first threshold voltage Vth1 (a time t0 to a time t1)

First, a case is explained in which the input voltage Vin of the high-voltage dividing circuit 31 has not exceeded the first threshold voltage Vth1 and is smaller than the first threshold voltage Vth1.

In this case, the input voltage Vin of the high-voltage dividing circuit 31 is applied, as a voltage (Vbe>transistor-on voltage=0.6 V), between the base and the emitter of the second NPN transistor 43 through the resistor 44 and the resistor 46. Then, a certain current flows between the collector and the emitter of the second NPN transistor 43.

Meanwhile, a voltage equal to or larger than a breakdown voltage (e.g., 8.2 V) is not applied to the Zener diode 51, and thus the first NPN transistor 42 is off.

Consequently, when the input voltage Vin of the high-voltage dividing circuit 31 is smaller than the first threshold voltage Vth1 as illustrated in (a) in FIG. 3, only a minute amount of current, which is supplied through the resistors 44, 45, and 47 and flows between the base and the emitter of the transistor 43, flows through the LED 48 included in the photocoupler as illustrated in (b) in FIG. 3. The LED 48 therefore does not emit light.

As a result, an output signal of the output circuit 33 is at "L" level, as illustrated in (c) in FIG. 3, indicating that the input voltage Vin of the high-voltage dividing circuit 31 is in a state of being incapable of supplying power (in this case, the output voltage Vout is smaller than the first threshold voltage Vth1).

In this case, the ECU 60 determines the state of the relay RL1 to be off because the input voltage Vin of the high-voltage dividing circuit 31 is in a state of being incapable of supplying power. If an output signal of the output circuit 33 is at "L" level after a certain time has elapsed since an issuance of an instruction to turn on the relay RL1, the ECU 60 determines that the relay RL1 is in an error state in which the relay RL1 cannot turn on. The ECU 60 then performs predetermined control for the error, and causes a notification to be sent to a user on the abnormality of the relay RL1.

The ECU 60 determines that the relay RL1 is normal if an instruction to turn on the relay RL1 has not been issued or an instruction to turn off the relay RL1 has been issued.

(2) When the input voltage Vin of the high-voltage dividing circuit 31 is equal to or larger than the first threshold voltage Vth1 during voltage rise, and equal to or larger than the second threshold voltage Vth2 during voltage drop (the time t1 to a time t2)

Next, a case is explained in which the input voltage Vin of the high-voltage dividing circuit 31 is equal to or larger than the first threshold voltage Vth1 during voltage rise, and equal to or larger than the second threshold voltage Vth2 during voltage drop.

In this case, a voltage equal to a breakdown voltage (e.g., 8.2 V) is applied to the Zener diode 51, and a current proportional to the input voltage Vin flows through the Zener diode 51.

Then, the first NPN transistor 42 turns on, and as illustrated in (b) in FIG. 3, a substantially constant current=ILEDmax flows through the LED 48.

The following explains the reason why the current ILEDmax is substantially constant.

The current ILEDmax is given by the following expression:

$$I_{LEDmax} = (Va - \text{a voltage drop of the LED 48} - \text{a collector-emitter voltage } V_{CE} \text{ when the first NPN transistor 42 is on})/(\text{the resistance value of the resistor 45} + \text{the resistance value of the resistor 47})$$

where Va is a voltage at the junction point between the resistor 44 and the resistor 45.

In an operational range of the Zener diode 51 when the input voltage is equal to or larger than a breakdown voltage, the voltage Va is substantially constant.

Thus, the above-described expression gives the current ILEDmax being substantially constant.

The term "substantially constant" is used because the current ILEDmax given by the above expression slightly increases. This increase is caused in the following manner: after breakdown of the Zener diode 51, as the output voltage of the high-voltage dividing circuit 31 further increases, the voltage across the Zener diode 51 slightly increases (e.g., +0.1 V), which increases the base current of the transistor 42, and the base-emitter voltage of the transistor 42 slightly increases (e.g., +0.1 V), whereby the voltage Va slightly increases (e.g., 9.0 V).

However, as long as expected fluctuation in the input voltage of the high-voltage dividing circuit 31 is within the range between the first threshold voltage Vth1 (or the second threshold voltage Vth2) and the voltage Vmax, the fluctuation in the base-emitter voltage of the first NPN transistor 42 due to the fluctuation in the current flowing through the resistor 52 is within a range that does not cause large fluctuation in the current flowing through the LED 48 in a macroscopic viewpoint.

The voltage division ratio of the voltage dividing circuit 41 is defined to be 14.6:1, for example. That is, when the breakdown voltage of the Zener diode 51 is 8.2 V, the voltage across the resistor 52 is approximately 0.6 V. Such a voltage division ratio can decrease the voltage division ratio at the high-voltage dividing circuit 31, and allows a smaller resistance value to be used for a voltage-dividing resistor included in the high-voltage dividing circuit 31, thereby reducing heat generation and enabling more accurate measurement.

Meanwhile, when the first NPN transistor 42 turns on, the base and the emitter of the second NPN transistor 43 are short-circuited. The second NPN transistor 43 thus turns off and no current flows between the collector and the emitter of the second NPN transistor 43.

The output signal of the output circuit 33 is at "H" level, as illustrated in (c) in FIG. 3, indicating that the input voltage Vin of the high-voltage dividing circuit 31 is in a state of being capable of supplying power (in this case, the output voltage Vout is equal to or larger than the first threshold voltage Vth1).

Because the output signal of the output circuit 33 is at "H" level, that is, the input voltage Vin of the high-voltage dividing circuit 31 is in a state of being capable of supplying power (in this case, equal to or larger than the first threshold voltage Vth1), the ECU 60 determines that the relay is on.

If an output signal of the output circuit 33 is at "H" level after a certain time has elapsed since an issuance of an instruction to turn on the relay RL1, the ECU 60 determines that the relay RL1 is in a normal state in which the relay RL1 has normally turned on. In this case, the ECU 60 performs control by determining whether current is normally flowing on the basis of an amplified current detection signal output by the amplified output circuit 23 of the current detecting circuit 12.

The ECU 60 determines that the relay RL1 is in an error state in which the relay RL1 cannot turn off (e.g., weld shut) if an instruction to turn on the relay RL1 has not been issued or an instruction to turn off the relay RL1 has been issued. The ECU 60 then performs predetermined control for the error, and causes a notification to be sent to a user on the abnormality of the relay RL1.

Furthermore, the ECU performs various control on the basis of a voltage detection signal output by the voltage detecting circuit 13 and an amplified current detection signal output by the current detecting circuit 12.

(3) When the input voltage Vin of the high-voltage dividing circuit 31 has decreased smaller than the second threshold voltage Vth2 from a voltage equal to or larger than the second threshold voltage Vth2 (after the time t2)

When the input voltage Vin of the high-voltage dividing circuit 31 has decreased smaller than the second threshold voltage Vth2 from a voltage equal to or larger than the second threshold voltage Vth2, the input voltage Vin of the high-voltage dividing circuit 31 is applied, as a voltage (Vbe), between the base and the emitter of the second NPN transistor 43 through the resistor 44 and the resistor 46. Then, a certain current flows between the collector and the emitter of the second NPN transistor 43.

Meanwhile, the voltage applied to the Zener diode 51 decreases smaller than the breakdown voltage (e.g., 8.2 V) again and the first NPN transistor 42 turns off again. Consequently, when the input voltage Vin of the high-voltage dividing circuit 31 is smaller than the second threshold voltage Vth2 as illustrated in (a) in FIG. 3, only a minute amount of current, which flows between the base and the emitter of the transistor 43, flows through the LED 48 included in the photocoupler as illustrated in (b) in FIG. 3. The LED 48 therefore does not emit light.

As a result, the output signal of the output circuit 33 is at "L" level, as illustrated in (c) in FIG. 3, indicating that the input voltage Vin of the high-voltage dividing circuit 31 is again in a state of being incapable of supplying power (in this case, the output voltage Vout is smaller than the second threshold voltage Vth2).

Therefore, the ECU 60 determines the state of the relay RL1 to be off because the input voltage Vin of the high-voltage dividing circuit 31 is in a state of being incapable of supplying power.

The output voltage is varied in the above description. However, if the ECU 60 controls the power supply monitoring apparatus to normally turn on the relay RL1 and the power of the main battery BT1 is sufficient, an immediate transition to the above-described state between the time t1 and the time t2 should be made, whereby the ECU 60 can determine that the relay RL1 has normally turned on. By contrast, if the ECU 60 controls the power supply monitoring apparatus to normally turns off the relay RL1 being on, an immediate transition to the above-described state after the time t2 should be made, whereby the ECU 60 can determine that the relay RL1 has normally turned off.

If the relay RL1 cannot transfer to an appropriate control state, the ECU 60 detects that the relay RL1 is in an error state, performs predetermined control for the error, and causes a notification to be sent to a user on the abnormality of the relay RL1.

As described above, according the present embodiment, the current that flows through an LED included in a photocoupler for insulating a high-voltage system from a low-voltage system can be limited to a current equal to or smaller than the certain allowable maximum current (ILEDmax in the present embodiment), and therefore the life of the LED included in the photocoupler can be extended.

Furthermore, a Zener diode connected in the reverse direction is used as a voltage-dividing resistor included in a voltage dividing circuit at an input stage of the Schmitt trigger circuit 32. The Zener diode is selected to have a positive temperature coefficient with respect to temperature property, which is opposite to the temperature property (negative temperature coefficient) of a transistor including the base terminal to which a voltage divided by the voltage dividing circuit is applied. This configuration can improve the accuracy of voltage measurement.

Specifically, when the maximum voltage Vmax, which is the maximum value of the input voltage Vin, is set to 300 V and an operating temperature range is set to −30° C. to 85° C., an actual voltage detection error is ±2 to ±3 V with respect to the first threshold voltage Vth1 or the second threshold voltage Vth2 being a reference. This result indicates that the accuracy of the voltage detection has no problem with practical use.

The following explains a modification of the embodiment.

Figure 4:
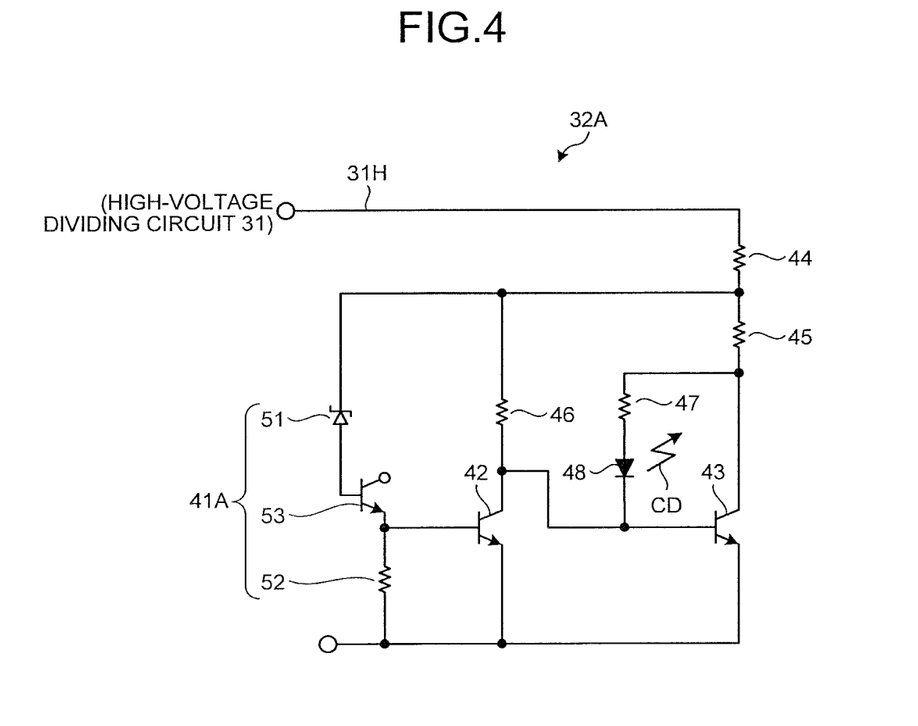
FIG. 4 is a diagram for explaining another exemplary circuit structure of the Schmitt trigger circuit.

FIG. 4 is diagram for explaining another exemplary circuit structure of the Schmitt trigger circuit.

The Schmitt trigger illustrated in FIG. 4 is different from that illustrated in FIG. 2 in that a voltage dividing circuit 41A, which is a replacement for the voltage dividing circuit 41, includes a third NPN transistor 53 that is inserted at a junction point between the Zener diode 51 and the resistor 52.

In other words, the Schmitt trigger circuit illustrated in FIG. 4 is different in that the third NPN transistor 53 is disposed, including a base terminal connected to the anode terminal of the Zener diode, an emitter terminal connected to one end of the resistor 52, and a collector terminal remained open.

The third NPN transistor 53 effectively functions as a diode having less voltage drop, allowing a minute amount of base current to flow.

As described above, in view of temperature property, when the Zener diode 51 is selected to have a positive temperature coefficient and the temperature property of the anode-cathode voltage is 4.4 mV/° C., for example, the first NPN transistor 42 and the third NPN transistor 53 have negative temperature coefficients. For example, the temperature property of the base-emitter voltage (Vbe) is −2.2 mV/° C.

Consequently, the fluctuation in the emitter-collector current of the first NPN transistor 42 due to the fluctuation in ambient temperature is further canceled out, and thus reduced, than in the case of the Schmitt trigger circuit illustrated in FIG. 2 by the temperature property of the Zener diode 51 and the temperature property of the third NPN transistor 53, thereby improving the accuracy of measurement performed by the voltage detecting circuit 13.

The present embodiment exerts advantageous effects that can improve the accuracy of voltage measurement while extending the life of an LED included in a photocoupler.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A Schmitt trigger circuit comprising:
   a voltage dividing circuit configured to divide an input voltage and output a divided voltage; and
   a basic Schmitt trigger circuit configured to include a plurality of transistors as current controlling elements and control current flowing through a light emitting diode (LED) included in an external photocoupler on the basis of an output voltage of the voltage dividing circuit proportional to the input voltage,
   wherein the voltage dividing circuit has a positive temperature coefficient,
   wherein the plurality of transistors include a first transistor and a second transistor, and
   wherein a cathode terminal of the LED is connected to a junction point between a collector terminal of the first transistor and a base terminal of the second transistor.

2. The Schmitt trigger circuit according to claim 1, wherein the voltage dividing circuit includes:
   a Zener diode connected in a reverse direction, and
   a voltage-dividing resistor connected to a low-potential side of the Zener diode.

3. The Schmitt trigger circuit according to claim 1, wherein the voltage dividing circuit includes a Zener diode having a positive temperature coefficient.

4. The Schmitt trigger circuit according to claim 2, wherein the Zener diode has a positive temperature coefficient.

5. The Schmitt trigger circuit according to claim 1, wherein the voltage dividing circuit has the positive temperature coefficient which cancels out a negative temperature property of a base-emitter voltage of the transistors.

6. A Schmitt trigger circuit comprising:
   a voltage dividing circuit configured to divide an input voltage and output a divided voltage; and
   a basic Schmitt trigger circuit configured to include a transistor as a current controlling element and control current flowing through a light emitting diode (LED) included in an external photocoupler on the basis of an output voltage of the voltage dividing circuit proportional to the input voltage, wherein the voltage dividing circuit has a positive temperature coefficient,
wherein the transistor includes:
   a first NPN transistor including a base terminal connected to an output terminal of the voltage dividing circuit, and
   a second NPN transistor including a base terminal connected to a collector terminal of the first NPN transistor, and
wherein the LED has a cathode terminal connected to a junction point between the collector terminal of the first NPN transistor and the base terminal of the second NPN transistor.

7. A power supply monitoring apparatus comprising:
a Schmitt trigger circuit including:
   a first voltage dividing circuit configured to divide an input voltage from an external power supply and output a divided voltage, and
   a basic Schmitt trigger circuit configured to include a second voltage dividing circuit having a positive temperature coefficient and dividing an output voltage of the first voltage dividing circuit, and a plurality of transistors as current controlling elements, and control current flowing through a light emitting diode (LED) included in a photocoupler on the basis of an output voltage of the second voltage dividing circuit; and
an output circuit configured to include a phototransistor included in the photocoupler and output power source monitoring information to outside,
wherein the plurality of transistors include a first transistor and a second transistor, and
wherein a cathode terminal of the LED is connected to a junction point between a collector terminal of the first transistor and a base terminal of the second transistor.

* * * * *